US006427596B1

(12) United States Patent
Bhambra et al.

(10) Patent No.: US 6,427,596 B1
(45) Date of Patent: Aug. 6, 2002

(54) METHOD FOR MAKING CORRECTIONS ON PLANOGRAPHIC PRINTING PLATES

(75) Inventors: Harjit S. Bhambra, Leeds; Robert M. Organ, Wantage; Kelvin Dickinson, Batley, all of (GB)

(73) Assignee: Kodak Polychrome Graphics, LLC, Norwalk, CT (US)

( * ) Notice: Subject to any disclaimer, the term of this patent is extended or adjusted under 35 U.S.C. 154(b) by 0 days.

(21) Appl. No.: 09/440,945

(22) Filed: Nov. 16, 1999

Related U.S. Application Data

(63) Continuation of application No. PCT/GB98/01504, filed on May 22, 1998, now abandoned.

(30) Foreign Application Priority Data

May 23, 1997 (GB) ............................................ 9710552

(51) Int. Cl.[7] .............................. G03F 7/30; B41N 3/03

(52) U.S. Cl. ....................... 101/465; 101/455; 101/478; 430/329

(58) Field of Search ................................ 101/453, 454, 101/457, 459, 460, 462, 463.1, 465, 466, 478, 455; 430/302, 329

(56) References Cited

U.S. PATENT DOCUMENTS

| | | | | | |
|---|---|---|---|---|---|
| 2,714,066 | A | * | 7/1955 | Jewett et al. | 101/456 |
| 3,181,461 | A | | 5/1965 | Fromson | 101/456 |
| 3,470,013 | A | | 9/1969 | Wagner | 101/453 |
| 3,640,221 | A | | 2/1972 | Wyke | 101/453 |
| 3,922,171 | A | | 11/1975 | Palmer | 106/23 |
| 3,963,594 | A | | 6/1976 | Brasko | 205/658 |
| 3,971,660 | A | | 7/1976 | Staehle | 101/455 |
| 4,052,275 | A | | 10/1977 | Gumbinner | 428/687 |
| 4,072,589 | A | | 2/1978 | Golda et al. | 205/658 |
| 4,131,518 | A | | 12/1978 | Fromson | 101/459 |
| 4,268,609 | A | | 5/1981 | Shiba et al. | 430/271.1 |
| 4,330,605 | A | | 5/1982 | Boston | 430/14 |
| 4,396,703 | A | * | 8/1983 | Matsumoto et al. | 101/465 |
| 4,420,549 | A | | 12/1983 | Cadwell | 430/158 |
| 4,457,971 | A | | 7/1984 | Cadwell et al. | 428/323 |
| 4,542,089 | A | | 9/1985 | Cadwell et al. | 430/276 |
| 4,567,131 | A | | 1/1986 | Watkiss | 430/309 |
| 4,778,616 | A | | 10/1988 | Gillich | 252/135 |
| 5,112,401 | A | | 5/1992 | Yoshida | 106/287.19 |
| 5,171,650 | A | | 12/1992 | Ellis et al. | 430/20 |
| 5,342,435 | A | | 8/1994 | Walls | 106/2 |
| 5,462,833 | A | | 10/1995 | Harquier | 430/159 |
| 5,738,944 | A | * | 4/1998 | Fromson et al. | 101/459 |
| 5,881,645 | A | | 3/1999 | Lenny et al. | 101/463.1 |
| 5,945,262 | A | * | 8/1999 | Deprez | 101/465 |
| 6,182,571 | B1 | * | 2/2001 | Jolliffe et al. | 101/465 |

FOREIGN PATENT DOCUMENTS

| | | | | |
|---|---|---|---|---|
| DE | 112615 | | 12/1898 | |
| EP | 0003993 | | 2/1979 | |
| EP | 0028137 | | 5/1981 | |
| EP | 0110417 | | 6/1984 | |
| EP | 0517960 | | 6/1991 | |
| EP | 565006 | * | 10/1993 | |
| EP | 0619524 | | 10/1994 | |
| EP | 0619525 | | 10/1994 | |
| EP | 0620502 | | 10/1994 | |
| EP | 0653685 | | 5/1995 | |
| GB | 0956376 | | 4/1964 | |
| GB | 1010264 | | 11/1965 | |
| GB | 1196886 | | 7/1970 | |
| GB | 1272868 | | 5/1972 | |
| GB | 1439127 | | 6/1976 | |
| GB | 2031442 | | 4/1980 | |
| GB | 1592281 | | 7/1981 | |
| GB | 2069164 | | 8/1981 | |
| GB | 2080964 | | 2/1982 | |
| GB | 2109573 | | 6/1983 | |
| GB | 2166255 | | 4/1986 | |
| GB | 2222553 | | 3/1990 | |
| IT | 94000448 | | 10/1994 | |
| JP | 56084994 | | 7/1981 | 101/455 |
| JP | 63268642 | | 11/1998 | |
| WO | 9719819 | | 6/1977 | |
| WO | 8901871 | | 3/1989 | |
| WO | 9112140 | | 8/1991 | |
| WO | 9405507 | | 3/1994 | |

OTHER PUBLICATIONS

PCT Search Report for PCT/GB98/01504.
"Hawley's Condensed Chemical Dictonary", 10th Ed., G.C. Hawley, Nan Nostrand Reinhold, New York, 1987, pp. 1072–1073.
"Chemistry of the Elements," N. N. Greenwood & A. Earnshaw, Pergammon Press, Oxford, 1985, pp. 396 & 398.

* cited by examiner

*Primary Examiner*—Stephen R. Funk
(74) *Attorney, Agent, or Firm*—Ratner & Prestia

(57) ABSTRACT

A method for correcting mistakes and other imperfections in printing members is disclosed. Ink accepting areas of the printing member are rendered non-ink accepting by treatment with a deletion fluid. Deletion fluids include, for example, acids, alkalis, and oxidizing formulations. A preferred deletion fluid is concentrated sulfuric acid.

21 Claims, No Drawings

METHOD FOR MAKING CORRECTIONS ON PLANOGRAPHIC PRINTING PLATES

CROSS-REFERENCE TO RELATED APPLICATIONS

This application is a continuation of PCT/GB98/01504, filed May 22, 1998, now abandoned, which claims priority on GB 9710552.2, filed May 23, 1997.

FIELD OF THE INVENTION

This invention relates to planographic printing, especially lithographic printing. Particularly, although not exclusively, it relates to the correction of mistakes or other imperfections on printing members, for example printing plates, by rendering ink accepting areas non-ink accepting.

BACKGROUND OF THE INVENTION

Our co-pending applications PCT/GB96/02883 (U.S. Pat. No. 6,105,500), PCT/GB98/01500, and PCT/GB98/01496, all three of which are incorporated herein by reference, describe a printing plate that comprises a support provided with a hydrophilic layer comprising a binder based on a material having Si—O bonds in which particulate material is dispersed and an image layer over the hydrophilic layer. Such a hydrophilic layer can advantageously be applied to a wide range of different support materials, for example metals such as aluminum; plastics, such as polyester; and also paper. Printing plates including a hydrophilic layer as described have excellent printing properties. However, a problem has now been noted in relation to the rendering of ink accepting areas non-ink accepting as may be required to correct mistakes or other imperfections on the printing plates.

It is well-known in the printing industry to remove or delete unwanted image material utilizing a deletion fluid, which may be applied to areas to be removed using a brush, a pen or other means. Known deletion fluids for negative plates commonly utilize a hydrogen fluoride solution in combination with an organic solvent and other additives. Hydrogen fluoride based deletion fluids generally remove image material very well. However, it has been noted that, in relation to plastic plates comprising a hydrophilic layer of the type described above, although most or all of an unwanted image area to which a known deletion fluid is applied is rendered non-ink accepting, there is often an area associated with and/or close to the unwanted image area which should be non-ink accepting but is found to be ink accepting. Consequently, such an area accepts ink during printing and leads to imperfections in printed material.

The inadequacies of hydrogen fluoride based deletion fluids in relation to hydrophilic layers of the type described have, to the applicant's knowledge, been unappreciated in the past and, furthermore, the reasons for the apparent inadequate deletion of unwanted image areas using hydrogen fluoride based deletion fluids have not been investigated.

SUMMARY OF THE INVENTION

This invention is based on an appreciation of the existence of a problem with commercially-available hydrogen fluoride based deletion fluids and, additionally, on the discovery of the reasons for the problem. More particularly, it has been discovered that commercially-available hydrogen fluoride deletion fluids attack the aforesaid hydrophilic layer at a greater rate than that at which they attack the image layer and, consequently, the hydrophilic layer is removed in localized regions contacted by the deletion fluid. Such localized regions may be cosmetically undesirable because they imply a defective hydrophilic layer, and they may be undesirable from a performance perspective because they may be less hydrophilic and/or have a different ink-water balance compared to other regions of the plate and/or they may be more prone to wear.

The invention is a method of rendering non-ink accepting a selected ink accepting area of a printing member comprising a support and a hydrophilic layer that comprises a material having Si—O bonds and an image layer. The method comprises contacting the area with a means (hereinafter "the hydrophilizing means") that renders the area non-ink accepting at a greater rate than that at which it can remove the hydrophilic layer.

DETAILED DESCRIPTION OF THE INVENTION

The hydrophilic layer may be removed by the hydrophilizing means at a rate of less than 0.15 $\mu m.s^{-1}$, typically less than 0.1 $\mu m.s^{-1}$, preferably less than 0.05 $\mu m.s^{1-1}$, more preferably less than 0.02 $um.s^{-1}$.

The ink-accepting area may be rendered non-ink accepting within 3 minutes, typically 2 minutes, preferably 1½ minutes, more preferably within 1 minute, especially within 30 seconds or less of the first contact with the hydrophilizing means.

The rate of rendering of the ink-accepting area non-ink accepting may be at least 5 times, preferably at least 10 times, more preferably at least 20 times, especially at least 30 times the rate of removal of the hydrophilic layer. The relative rates of these processes can be readily compared by visual inspection. A printing member comprising a support, a hydrophilic layer, and a non-ink accepting area is treated with a hydrophilizing means and relative rates visually determined.

In a first embodiment, contact with the hydrophilizing means renders the ink accepting area non-ink accepting by removing the area.

The ink-accepting area may be removed at a rate of greater than 0.005 $gm^{-2}s^{-1}$, preferably greater than 0.01 $gm^{-2}s^{-1}$, more preferably greater than 0.05 $gm^{-2}s^{-1}$.

The thickness of the ink-accepting area may be at least 0.4 $\mu m$, preferably at least 0.8 $\mu m$, more preferably at least about 1 $\mu m$. The thickness of the ink-accepting area may be less than 10 $\mu m$, typically less than 8 $\mu m$, preferably less than 6 $\mu m$, more preferably less than 4 $\mu m$, especially less than 2 $\mu m$ or less.

Preferably, in the method, substantially the whole thickness of the ink-accepting area is removed, thereby to reveal an underlying layer which is non-ink accepting and which is typically the hydrophilic layer.

The hydrophilizing means may include one or more of acids and/or alkalis and/or oxidizing formulations.

Preferred acids include strong acids, for example inorganic acids such as sulfuric or nitric; weak inorganic acids, for example phospho-acids such as orthophosphoric; and organic acids for example carboxylic acids such as acetic and acrylic. Solutions comprising greater than 60%, preferably 70%, more preferably 80%, especially 90% of a the acid may be used. An especially preferred acid is sulfuric acid.

Preferred alkalis include sodium hydroxide, potassium hydroxide and silicates such as sodium silicate.

Preferred oxidizing formulations may include nitrites such as sodium nitrite; nitrates such as aluminum or potassium nitrate; halogen-based oxidizers for example peracids such as perchloric acid, perhalates such as periodates and perchlorates; hydrogen peroxide; transition metal oxidizing agents such as potassium permanganate, ferric chloride and chromium VI oxide.

The hydrophilizing means may include means for softening the hydrophilic layer.

The hydrophilizing means may include one or more solvents. Suitable solvents may include one or more of water; acids, typically of the type described above; and organic solvents, especially alcohols such as $C_{1-3}$ alcohols and/or alkoxyalcohols such as 2-butoxyethanol, cyclohexanone, N-methylpyrrolidone, gamma-butyrolactone, dimethyl sulfoxide and benzylalcohol.

The hydrophilizing means may include a thickener.

Components of the hydrophilizing means may be applied together or may be applied one after the other.

Especially preferred hydrophilizing means may include one or more of sulfuric acid, hydrogen peroxide, nitrates, transition metal oxidizing agents, potassium hydroxide and a silicate especially sodium silicate.

In a second embodiment, contact with the hydrophilizing means renders the ink-accepting area non-ink accepting by covering the area. In this case, the hydrophilizing means may comprise any material or materials which can be bonded to the image layer and which is/are non-ink accepting. The hydrophilizing means may comprise a first material, which is applied directly to the ink-accepting area, and a second material, which is arranged over the first material. For example, the first material may be provided to aid adhesion of the second material to the ink-accepting area.

The hydrophilizing means of the second embodiment may include one or more materials selected from a silicate material; a silicone based material; a hydrophilic polymeric material, especially an organic material such as gelatin, polyvinyl alcohol (PVA) or polyvinyl pyrrolidone (PVP); or a sol or a gel material. The aforesaid hydrophilizing means are collectively referred to hereinafter as "binder means".

The hydrophilizing means preferably comprises a fluid that is transformed to a non-fluid state after contact with the area. For example, the fluid may be transformed into a film after contact.

The hydrophilizing means may include a plurality of layers of material.

The hydrophilic layer of the printing plate which includes Si—O bonds may have an average thickness of less than 100 $\mu$m, typically less than 50 $\mu$m, preferably less than 20 $\mu$m, more preferably less than 10 $\mu$m, especially less than 5 $\mu$m. In some cases the hydrophilic layer may have an average thickness of less than 3 $\mu$m. The hydrophilic layer may have an average thickness of greater than 0.1 $\mu$m, typically greater than 0.3 $\mu$m, preferably greater than 0.5 $\mu$m, more preferably greater than 1 p$\mu$m.

The Ra of the hydrophilic layer may be measured using a Talysurf Plus fitted with a 112/2564-430 head, supplied by Rank Taylor Hobson Inc., Leicester, U.K. The Ra may be at least 0.2 $\mu$m, typically at least 0.25 $\mu$m, preferably at least 0.3 $\mu$m, more preferably at least 0.35 $\mu$m, especially at least 0.4 $\mu$m. The Ra may be less than 1.5 $\mu$m, typically less than 1 $\mu$m, preferably less than 0.8 $\mu$m, more preferably less than 0.7 $\mu$m, especially less than 0.6 $\mu$m, most preferably less than 0.5 $\mu$m.

The hydrophilic layer may include 1 to 20 g of material per meter squared of substrate. Preferably the layer includes 3 to 20 g, more preferably 5 to 18 g, of material per meter squared of substrate. Most preferably, the layer includes 8 to 16 g of material/meter$^2$.

The hydrophilic layer may include a binder material. The binder material preferably includes the material having Si—O bonds. The binder material may be a component of a polymeric material that includes Si—O bonds. The polymeric material may include —Si—O—Si—, especially —Si—O—moieties.

At least 50 wt %, typically at least 60 wt %, preferably at least 70 wt %, more preferably at least 80 wt %, especially at least 90 wt % of the binder material is made up of a polymeric material having Si—O bonds as described. Preferably, the binder material consists essentially of a polymeric material having Si—O bonds as described.

The binder material may make up at least 5 wt %, preferably at least 10 wt %, more preferably at least 15 wt %, especially at least 20 wt % of the hydrophilic layer. The binder material may make up less than 50 wt %, preferably less than 40 wt %, more preferably less than 30 wt %, especially less than 25 wt %, of the hydrophilic layer.

The binder material may be derived or derivable from a silicate material for example water glasses, metasilicates, orthosilicates, sesquisilicates and modified silicates such as borosilicate and phosphosilicate. The binder material is preferably derived or derivable from a silicate solution.

The binder material preferably includes less than 10 wt %, preferably less than 5 wt %, more preferably less than 1 wt %, especially substantially no, organic material, for example polymeric organic material.

Preferably, particulate material is provided in the hydrophilic layer, for example by being dispersed in the binder material thereof. Typically 30 to 85 wt %, preferably 40 to 80 wt %, more preferably 50 to 80 wt %, especially 60 to 80 wt %, of the hydrophilic layer is composed of the particulate material.

The particulate material may be organic or inorganic. Organic particulate materials may be provided by latexes. Inorganic particulate materials may be selected from alumina, silica, silicon carbide, zinc sulfide, zirconia, barium sulfate, talcs, clays (e.g. kaolin), lithopone and titanium oxide.

The particulate material may comprise a first particulate material. The first material may have a hardness of greater than 8 Modified Mohs (on a scale of 0 to 15), preferably greater than 9 and, more preferably, greater than 10 Modified Mohs. The first material may comprise generally spherical particles. Alternatively, the material may comprise flattened particles or platelets. The first material may have a mean particle size of at least 0.1 $\mu$m, preferably at least 0.5 $\mu$m and, more preferably, at least 1.0 $\mu$m. The first material may have a mean particle size of less than 200 $\mu$m, typically less than 100 $\mu$m, preferably less than 45 $\mu$m, more preferably less than 20 $\mu$m, especially less than 10 $\mu$m, and, most preferably, less than 5 $\mu$m. The particle size distribution for 95% of particles of the first material may be in the range 0.01 to 150 $\mu$m, preferably in the range 0.05 to 75 $\mu$m, more preferably in the range 0.05 to 30 $\mu$m. The first material preferably comprises an inorganic material. The first material preferably comprises alumina which term includes $Al_2O_3$ and hydrates thereof, for example $Al_2O_3$. $3H_2O$. Preferably, the material is $Al_2O_3$.

The hydrophilic layer may include at least 10 wt %, typically at least 20 wt %, preferably at least 25 wt %, more preferably at least 30 wt %, especially at least 35 wt % of the first particulate material. The hydrophilic layer may include less than 80 wt %, typically less than 70 wt %, preferably less than 60 wt %, more preferably less than 50 wt %, especially less than 40 wt % of the first particulate material.

The ratio of the wt % of the first particulate material to binder material may be in the range 0.5 to 2, preferably in the range 1 to 2, more preferably in the range 1.4 to 1.8.

The particulate material may comprise a second particulate material. The second material may have a mean particle size of at least 0.001 μm, typically at least 0.005 μm, preferably at least 0.01 μm, more preferably at least 0.05 μm, especially at least 0.1 μm. The second material may have a mean particle size of less than 200 μm, typically less than 100 μm, preferably less than 50 μm, more preferably less than 10 μm, especially less than 1 μm, most preferably less than 0.5 μm. The second material is preferably a pigment. The second material is preferably inorganic. The second material is preferably titanium dioxide.

The first and second particulate materials preferably define a multimodal, for example a bimodal particle size distribution.

The ratio of the wt % of the first particulate material to the second particulate material may be in the range 0.3 to 3, preferably 0.5 to 2, more preferably 0.75 to 1.33, especially about 1 to 1.

The hydrophilic layer may include at least 10 wt %, typically at least 20 wt %, preferably at least 25 wt %, more preferably at least 30 wt %, especially at least 35 wt % of the second particulate material. The hydrophilic layer may include less than 80 wt %, typically less than 70 wt %, preferably less than 60 wt %, more preferably less than 50 wt %, especially less than 40 wt % of the second particulate material. The ratio of the wt % of the second particulate material to binder material may be in the range 0.5 to 2, preferably in the range 1 to 2, more preferably in the range 1.4 to 1.8.

The hydrophilic layer may include one or more additional materials for improving its adhesion to a support, especially a plastic support. A preferred additional material is organic and is preferably polymeric. Resins are preferred.

The hydrophilizing means of the second embodiment described above may include additives to adjust its properties. For example, it may include materials for aiding deposition and/or abrasion resistance and/or for aiding the masking of the selected ink-accepting area and/or for aiding the hardening or curing or drying of the binder means. The hydrophilizing means may include first and/or second particulate materials, which may be as described in any statement herein.

Preferably, the binder material of the hydrophilic layer and the binder means of the hydrophilizing means include some or all of the same components. In a preferred embodiment, the binder material of the hydrophilic layer is derived from a silicate material and the binder means of the hydrophilizing means is also derived from the same silicate material. At least 50 wt %, typically at least 60 wt %, preferably at least 70 wt %, more preferably at least 80 wt %, especially at least 90 wt % of the composition of the hydrophilic layer is the same as that of the hydrophilizing means.

The support may comprise a metal layer. Preferred metals include aluminum, zinc and titanium, with aluminum being especially preferred. The support may comprise an alloy of the aforesaid metals. Other alloys that may be used include brass and steel, for example stainless steel.

The support may comprise a non-metal layer. Preferred non-metal layers include layers of plastic, paper or the like. Preferred plastics include polyester, especially polyethylene terephthlate.

The support may include one or a plurality of layers. Where the support comprises a plurality of layers, it may comprise a plastic, paper or textile layer and another layer. The other layer may be a metal layer, typically of a type described above. In this case, the support may comprise a metal to plastic or paper laminate; or metal may be applied by other means to plastic or paper, for example by sputtering or the like.

The image layer may comprise any known photosensitive material whether arranged to form a positive or negative plate. Examples of photosensitive materials include diazonium materials, polymers that undergo depolymerization or addition photopolymerization and silver halide gelatin assemblies. Examples of suitable materials are disclosed in: GB 1,592,281; GB 2,031,442 [Vikesland, U.S. Pat. No. 4,247,616]; GB 2,069,164; GB 2,080,964; GB 2,109,573; EP 0,377,589; Shiba, U.S. Pat. No. 4,268,609; and Watkiss, U.S. Pat. No. 4,567,131. The image layer is preferably arranged to form a negative plate.

In second aspect, the invention is a method of preparing a printing member for printing, the method comprising rendering non-ink accepting selected ink accepting areas of the member. The method preferably includes the step of causing printable information to become associated with a substrate, for example by information-wise exposing a non-exposed printing member, and inspecting the member to determine the selected ink-accepting areas to be rendered non-ink accepting.

The printing member preferably includes a hydrophilic layer prepared by contacting a support with a fluid comprising a silicate liquid in which particulate material is dispersed.

The silicate liquid may comprise a solution of any soluble silicate including compounds often referred to as water glasses, metasilicates, orthosilicates and sesquisilicates. The silicate liquid may comprise a solution of a modified silicate for example a borosilicate or phosphosilicate.

The silicate liquid may comprise one or, more preferably only one, metal or non-metal silicate. A metal silicate may be an alkali metal silicate. A non-metal silicate may be quaternary ammonium silicate.

The silicate liquid may be formed from silicate in which the ratio of the number of moles of silicon-containing species, for example $SiO_2$, to the number of moles of cationic, for example metal, species is in the range 0.25 to 10, preferably in the range 0.25 to about 6, more preferably in the range 0.5 to 4.

The silicate liquid is preferably alkali metal silicate. In this case, the ratio of the number of moles of $SiO_2$ to the number of moles of $M_2O$ in the silicate, where M represents an alkali metal may be at least 0.25, typically at least 0.5, preferably at least 1, more preferably at least 1.5. Especially preferred is the case in which the ratio is at least 2.5. The ratio may be less than 6, preferably less than 5 and more preferably less than 4.

Preferred alkali metal silicates include lithium, sodium and potassium silicates, with lithium and/or sodium silicate being especially preferred. A silicate liquid comprising only sodium silicate is most preferred.

The fluid may comprise 2 to 30 wt % of silicate (e.g. dissolved sodium silicate solid), preferably 5 to 20 wt %, more preferably 8 to 16 wt %. The liquid may be prepared using 10 to 60 wt %, preferably 30 to 50 wt %, more preferably 35 to 45 wt % of a silicate solution which comprises 30 to 40 wt % silicate.

The fluid may include 5 to 60 wt % of particulate material. Preferably, the fluid includes 10 to 50 wt %, more preferably 15 to 45 wt %, especially 20 to 40 wt % of particulate material.

The ratio of the weight of silicate to the weight of particulate material in the fluid is preferably in the range 0.1 to 2 and, more preferably, in the range 0.1 to 1. Especially preferred is the case in which the ratio is in the range 0.2 to 0.6.

The fluid may include more than 20 wt %, preferably more than 30 wt %, more preferably more than 40 wt %, especially more than 45 wt % water (including water included in the silicate liquid). The fluid may include less than 80 wt %, preferably less than 70 wt %, more preferably less than 65 wt %, especially less than about 60 wt % water.

Where the fluid comprises a silicate and the particulate material comprises the first material and the second material, the ratio of the wt % of silicate (e.g. dissolved sodium silicate solid) to the wt % of the first material may be in the range 0.25 to 4, preferably in the range 0.5 to 1.5 and more preferably about 1. Similarly, the ratio of the wt % of silicate to the wt % of the second material may be in the range 0.25 to 4, preferably in the range 0.5 to 1.5 and more preferably about 1. The ratio of the wt % of first material to the wt % of second material may be in the range 0.5 to 2, preferably in the range 0.75 to 1.5, more preferably about 1 to 1.

The particulate material may include a third material which is preferably adapted to lower the pH of the fluid. The third material may be a colloid, typically colloidal silica or an inorganic salt, typically a phosphate, with aluminum phosphate being preferred. Preferably less than 30wt %, more preferably less than 20wt %, especially less than 10 wt % of the total particulate material in the fluid is comprised by the third material.

The pH of the fluid may be greater than 9.0, is preferably greater than 9.5 and, more preferably, greater than 10.0. Especially preferred is the case in which the pH is greater than 10.5. The pH is typically controlled so that the silicate remains in solution and does not form a gel. A gel is generally formed when the pH of a silicate solution falls below pH 9. The pH of the fluid is preferably less than 14, more preferably less than 13.

The fluid may include other compounds for adjusting its properties. For example, the fluid may include one or more surfactants. The fluid may include 0 to 1 wt % of surfactant (s). A suitable class of surfactants comprises anionic sulfates or sulfonates. The fluid may include viscosity builders for adjusting the viscosity of the liquid. The fluid may include 0 to 10 wt %, preferably 0 to 5 wt % of viscosity builder(s). Also, the fluid may include dispersants for dispersing the inorganic particulate material throughout the fluid. The fluid may include 0 to 2 wt % of dispersant(s). A suitable dispersant may be sodium hexametaphosphate.

The fluid may have a viscosity of less than 100 centipoise when measured at 20° C. and a shear rate of $200s^{-1}$ using a Mettler Rheomat 180 Viscometer incorporating a double gap measuring geometry. Preferably, the viscosity is less than 50 centipoise, more preferably less than 30 centipoise when measured as aforesaid. Especially preferred is the case in which the viscosity is less than 20 centipoise.

The fluid may be applied to the support by any suitable means, which is preferably non-electrochemical.

The fluid may be applied to both sides of the support in order to form hydrophilic layers on both sides. A support with such a layer on both sides may be used to prepare a double-sided lithographic plate. Alternatively, if such a support is used for a single-sided plate, the side of the plate that does not carry an image layer may be protected by the hydrophilic layer. The fluid is preferably applied to only one surface of the support.

In the method, water is typically removed from the fluid after application. It is believed that, when a silicate liquid is used, this results in the silicate polymerizing, and thereby binding the particulate materials in position.

In a third aspect, the present invention is a printing member including non-ink accepting areas prepared according to the first aspect.

In a fourth aspect, the invention is any novel hydrophilizing means for rendering non-ink accepting a selected ink-accepting area of a printing member per se.

In a fifth aspect, the invention is the use of a hydrophilizing means as described herein for rendering non-ink accepting a selected ink-accepting area of a printing member.

In a sixth aspect, the invention is a method of printing using a printing member as described herein.

In a seventh aspect, the invention is a method of rendering non-ink accepting a selected ink-accepting area of a printing member, the method comprising contacting the selected area with a means (herein "the hydrophilizing means") which renders the area non-ink accepting by covering the area.

The advantageous properties of this invention can be observed by reference to the following examples, which illustrate but do not limit the invention.

EXAMPLES

A Preparation of Lithographic Printing Plate.

Example 1

Step 1—Preparation of Aluminum

A 0.2 mm gauge aluminum alloy sheet of designation AA1050 was cut to a size of 459 mm by 525 mm. The sheet was then immersed face up in a solution of sodium hydroxide dissolved in distilled water (100 g/L) at ambient temperature for 60 seconds and thoroughly rinsed with water.

Step 2—Preparation of coating formulation

The following reagents are used in the preparation:

Sodium silicate solution having a ratio $SiO_2$:$Na_2O$ in the range 3.17 to 3.45 (average about 3.3); a composition of 27.1–28.1 wt % $SiO_2$, 8.4–8.8 wt % $Na_2O$, with the balance being water; and a density of about 75 Twaddel (°Tw), equivalent to 39.5 Baumé (°Bé) and a specific gravity of 1.375.

Deionized water having a resistivity of 5 Mohm.cm $Al_2O_3$ powder comprising alumina (99.6%) in the shape of hexagonal platelets. The mean particle size is 3 $\mu$m. The powder has a hardness of 9 Moh (on a 0–10 hardness scale).

Anatase titanium dioxide having a mean primary particle size of 0.2 $\mu$m.

Deionized water (150 g; 40 wt %) was added to a 250 mL beaker and sheared using a Silverson high shear mixer. Titanium dioxide powder (53.29 g; 14.21 wt %) was then added in portions over a period of four minutes with the shearing continuing. Then, alumina powder (53.29 g; 14.21 wt %) was added in portions over a period of four minutes with the shearing continuing. On completion of the addition, sodium silicate solution (118.43 g; 31.58 wt %) was added with shearing for a further three minutes. The viscosity of the liquid was found to be about 10 centipoise when measured at 20° C. and a shear rate of 200 $s^{-1}$ using a Mettler Rheomat 180 Viscometer incorporating a double gap measuring geometry.

Step 3—Application of coating formulation

The coating formulation prepared in Step 2 was coated onto the aluminum sheet prepared in Step 1 using a rotating Meyer bar coater (designation K303) to give a 12 $\mu$m wet film thickness.

Step 4—Drying the formulation

The coated sheet prepared in Step 3 was placed in an oven at 130° C. for 80 seconds. The plate was then removed from the oven and allowed to cool to ambient temperature.

The Ra of the sheet was 0.45 $\mu$m measured using a Hommelmeter T2000 having an LV-50 measuring head.

Step 5—Post-drying treatment

The dried sheet prepared in Step 4 was immersed in aluminum sulfate (0.1 M) for thirty seconds. The sheet was then spray rinsed for about twenty seconds using tap water and fan dried.

Step 6—Application of light sensitive coating

A printing plate was produced from the sheet prepared in Step 5 by coating to a dry coating weight of 1 $gm^{-2}$ using a Meyer bar, a negative light sensitive material comprising Ronacoat R0300 photopolymer (89 wt %) and Ronacoat R0301 sensitizer (9 wt %) as major components. The light sensitive material was dried at 100° C. for 60 seconds.

B Exposure and Development of Lithographic Plate

Example 2

The plate of Example 1, step 6 was exposed to 190 exposure units (equivalent to 80 $mJcm^{-1}$) and developed using a developer comprising sodium metasilicate as main active ingredient sold under the tradename GOLDSTAR by Horsell Anitec.

C Post-development Deletion of Unwanted Image Areas Using Deletion Fluids

The ability of various fluids or combinations of fluids (i.e., hydrophilizing means) described below in Examples 3 to 10 and comparative Examples C1 and C2 to remove (or delete) a small (1.5 cm by 1.5 cm) image area from plates prepared as described in Example 2 was assessed by applying the fluids to the area of image to be removed using suitable means, optionally agitating the area, wiping the area with cotton wool, rinsing the area with tap water, assessing the area, inking in the area using RAPIDINK™ applied using damp cotton wool, and visually assessing whether the area inked in or not, thereby indicating whether the particular fluids successfully removed the image area.

Example 3

12.5 wt % of a sodium silicate solution comprising $SiO_2$ (27 wt %) and sodium oxide (14 wt %) was mixed with alcoholic potassium hydroxide which comprises potassium hydroxide (25 wt %) in methanol. 3–4 drops of the solution were applied to an area of a plate to be deleted and then the plate was placed in an oven at 130° C. for 80 seconds. On removal from the oven, the plate was rinsed with water.

Example 4

A thin layer of a solvent comprising water/2-butoxyethanol (50/50) was brushed onto the surface of the image area and allowed to penetrate the image area so that it softened. Thereafter, a few drops of concentrated sulfuric acid (98%) were applied using a pipette, followed by mixing using the pipette. After 60 seconds, the area was washed as described above.

Example 5

A solution (green in color) comprising potassium permanganate (5 wt %) in concentrated sulfuric acid (98% concentrated) was applied as a thin layer.

Example 6

Hydrogen peroxide (30% w/v) was applied to the image area and then concentrated sulfuric acid (98%) was added dropwise.

Example 7

Ammonium nitrate (5 wt %) in concentrated sulfuric acid (98%) was applied to the area.

Example 8

Ammonium fluoride (5 wt %) in methanol was applied to the area. Then, concentrated sulfuric acid (98%) was added dropwise to the area with mixing.

Example 9

Hydrogen peroxide at a temperature of about 70° C. was applied to the area.

Comparative Example 1 (Example C1)

A commercially available deletion fluid for negative plates was applied to the area, the fluid including 40% hydrofluoric acid (23.5 wt %), a PVP thickener (15.2 wt %) and water (28.3 wt %) and tetrahydrofuran (33 wt %) as solvents.

Comparative Example (Example C2)

A commercially available deletion fluid for negative plates was applied to the area, the fluid including 40% hydrofluoric acid (8.8 wt %), a PVP thickener (44.5 wt %), a dye and water (2.2 wt %) and cyclohexanone (44.5 wt %) as solvents.

Results

Table 1 below lists, for each example, the results of a visual assessment of the image area after application of the fluid but before inking; a visual assessment of an area around the image area after application of the fluid; and whether or not the image area inks in after application of the fluid.

TABLE 1

| Example No. | Visual assessment of image area after fluid application | Visual assessment of area around image area after fluid application | Does image area retain ink? |
|---|---|---|---|
| 3 | Area appears to have been removed | Area unaffected | No |
| 4 | Area appears to have been removed | Area unaffected | No |

TABLE 1-continued

| Example No. | Visual assessment of image area after fluid application | Visual assessment of area around image area after fluid application | Does image area retain ink? |
|---|---|---|---|
| 5 | Area appears to have been removed | Area unaffected | No |
| 6 | Area appears to have been removed | Area unaffected | Very slight retention of ink |
| 7 | Area appears to have been removed | Area unaffected | Very slight retention of ink |
| 8 | Area appears to have been removed | Area unaffected | Very slight retention of ink |
| 9 | Partial removal | Area unaffected | Slight retention of ink |
| C1 | Appears to have been removed | Area appears to have been severely affected | Image area does not retain ink, but area around image area does. |
| C2 | Appears to have been removed | Area appears to have been severely affected | Image area does not retain ink, but area around image area does. |

Discussion

Although the fluid in each of Examples 3 to 10 and C1 and C2 was capable of deleting the image area to greater or lesser extent to render it less ink-accepting, the fluid of examples C1 and C2 also severely attacked the hydrophilic layer of the substrate around the image area so that it was removed. This resulted in the exposure of bare aluminum, which was cosmetically unacceptable and/or was ink-accepting and/or has an ink-water balance which is different from the rest of the plate and/or is expected to have reduced wear resistance. Thus, the fluids of examples C1 and C2 cannot be used for deletion from plates having a hydrophilic layer of the type described.

D Post-development Covering of Unwanted Image Areas

Example 10

The coating formulation described in Example 1, Step 2 was applied using a brush to a small (1.5 cm by 1.5 cm) image area on a plate prepared as described in Example 2. In one example, the coating formulation was cured in an oven at 130° C. for 80 seconds; in another example, the coating was fan dried for 50 seconds at 50° C.

Results

The coating formulation covered the image area and rendered it non-ink accepting.

Having described the invention, we now claim the following and their equivalents.

What is claimed is:

1. A method for rendering non-ink accepting an ink accepting area of a printing member, in which:

the printing member comprises:

a support, a hydrophilic layer comprising a binder material having Si—O bonds, and an image layer comprising the ink accepting area;

the method comprising:

contacting the ink accepting area with a hydrophilizing means;

in which:

the hydrophilizing means is a fluid that renders the ink accepting area non-ink accepting by removing the ink accepting area, the rate at which the hydrophilizing means renders the ink accepting area non-ink accepting is greater than the rate at which it removes the hydrophilic layer, and the binder material consists essentially of a polymeric material having the Si—O bonds.

2. The method of claim 1 in which the rate at which the hydrophilizing means removes the hydrophilic layer is less than 0.15 $\mu$m/sec.

3. The method of claim 1 in which the ink accepting area is rendered non-ink accepting within three minutes.

4. The method of claim 1 in which the rate at which the hydrophilizing means renders the ink accepting area non-ink accepting is at least five times greater than the rate at which it removes the hydrophilic layer.

5. The method of claim 1 in which the rate at which the hydrophilizing means removes the ink accepting area is greater than 0.005 $gm^{-2}s^{-1}$.

6. The method of claim 1 in which the hydrophilizing means comprises one or more solvents.

7. The method of claim 1 in which the hydrophilizing means is selected from the group consisting of acids, alkalis, and oxidizing formulations.

8. The method of claim 1 in which the hydrophilizing means is selected from the group consisting of strong inorganic acids, weak inorganic acids, organic acids, hydroxides, silicates, nitrites, nitrates, peracids, perhalates, hydrogen peroxide, and transition metal oxidizing agents.

9. The method of claim 1 in which the binder material is substantially free of polymeric organic material.

10. The method of claim 1 in which the support is aluminum.

11. The method of claim 1 in which the hydrophilizing means is concentrated sulfuric acid.

12. The method of claim 1 in which the binder material makes up at least 5 wt % of the hydrophilic layer.

13. The method of claim 12 in which the binder material is a silicate.

14. The method of claim 13 in which:

the rate at which the hydrophilizing means removes the hydrophilic layer is less than 0.15 $\mu$m/sec, and the hydrophilizing means renders the ink accepting area non-ink accepting by removing the ink accepting area, and the rate at which the hydrophilizing means removes the ink accepting area is greater than 0.005 $gm^{-2}s^{-1}$.

15. The method of claim 13 in which the hydrophilic layer comprises a particular material.

16. The method of claim 15 in which:

the rate at which the hydrophilizing means removes the hydrophilic layer is less than 0.15 $\mu$m/sec, and the hydrophilizing means renders the ink accepting area non-ink accepting by removing the ink accepting area, and the rate at which the hydrophilizing means removes the ink accepting area is greater than 0.005 $gm^{-2}s^{-1}$.

17. The method of claim 16 in which the particulate material comprises a first particulate material having a mean particle size of at least 0.1 μm and less than 200 μm, and a second particulate material having a mean particle size of at least 0.001 μm and less than 200 μm.

18. The method of claim 17 in which the first particulate material has a hardness greater than 8 modified Mohs on a scale of 0 to 15;

the first particulate material has a mean particle size of at least 1.0 μm and less than 5 μm; and the second particulate material has a particle size of at least 0.1 μm and less than 0.5 μm.

19. The method of claim 18 in which the first particulate material is alumina and the second particulate material is titanium dioxide.

20. The method of claim 19 in which the hydrophilizing means is selected from the group consisting of strong inorganic acids, weak inorganic acids, organic acids, hydroxides, silicates, nitrites, nitrates, peracids, perhalates, hydrogen peroxide, and transition metal oxidizing agents.

21. The method of claim 20 in which the hydrophilizing means is concentrated sulfuric acid.

* * * * *

UNITED STATES PATENT AND TRADEMARK OFFICE

CERTIFICATE OF CORRECTION

PATENT NO. : 6,427,596 B1
DATED : August 6, 2002
INVENTOR(S) : Bhambra et al.

It is certified that error appears in the above-identified patent and that said Letters Patent is hereby corrected as shown below:

Column 3,
Line 58, delete "pμm" and insert therefore -- μm --;

Column 4,
Line 11, delete "-Si-O-" and insert therefore -- Si-O-Si-O --.

Signed and Sealed this

Thirty-first Day of December, 2002

JAMES E. ROGAN
*Director of the United States Patent and Trademark Office*